United States Patent [19]
Ozeki

[11] Patent Number: 5,422,851
[45] Date of Patent: Jun. 6, 1995

[54] SEMICONDUCTOR MEMORY DEVICE CAPABLE OF VERIFYING USE OF REDUNDANT CIRCUIT

[75] Inventor: Yuko Ozeki, Hyogo, Japan

[73] Assignee: Mitsubishi Denki Kabushiki Kaisha, Tokyo, Japan

[21] Appl. No.: 208,210

[22] Filed: Mar. 10, 1994

[30] Foreign Application Priority Data

Mar. 10, 1993 [JP] Japan ................................. 5-048465

[51] Int. Cl.$^6$ .............................................. G11C 7/00
[52] U.S. Cl. .................................... 365/200; 365/201; 365/222
[58] Field of Search ...................... 365/200, 222, 225.7, 365/201, 233, 210, 189.12, 239, 240; 371/10.1, 10.2

[56] References Cited

U.S. PATENT DOCUMENTS 4,480,199 10/1984 Varshney et al. ............... 365/200 X
5,124,949 6/1992 Morigami ............................ 365/210

FOREIGN PATENT DOCUMENTS 63-217600 9/1988 Japan .

Primary Examiner—Joseph A. Popek
Attorney, Agent, or Firm—Lowe, Price, LeBlanc & Becker

[57] ABSTRACT

The VRAM according to the present invention can readily and accurately verify from the outside whether a redundant circuit is being used or not, without provision of a new terminal. The VRAM includes a command signal generating circuit and a switch. The command signal generating circuit responds to a control signal externally received through an external terminal and an address signal to generate a command signal. The switch responds to the command signal from the command signal generating circuit to select between a quote signal from a quote signal generating circuit and a redundant signal from a fuse circuit. The selected signal is provided through one monitor terminal. The quote signal indicates which data stored in the upper side or lower side of a serial register is being provided. The redundant signal activates a redundant circuit.

8 Claims, 12 Drawing Sheets

SEMICONDUCTOR MEMORY DEVICE CAPABLE OF VERIFYING USE OF REDUNDANT CIRCUIT

BACKGROUND OF THE INVENTION

1. Field of the Invention

The present invention relates generally to semiconductor memory devices, and particularly to a semiconductor memory device, such as a DRAM and a VRAM, capable of verifying whether a redundant circuit is being used or not.

2. Description of the Background Art

FIG. 9 is a block diagram showing the whole structure of a conventional video random access memory (hereinafter referred to as VRAM). Referring to FIG. 9, the VRAM includes a memory cell array 1, a row decoder 2, a column decoder 3, an address buffer 4, address terminals 5, a random input/output buffer 6, and random input/output terminals 7.

Memory cell array 1 includes a plurality of memory cells arranged in a matrix constituted of rows and columns. Row decoder 2 selects any one row of memory cell array 1 according to an address signal from address buffer 4. Column decoder 3 selects an arbitrary column of memory cell array 1 according to an address signal from address buffer 4. Address buffer 4 converts an external address signal A0-An from address terminal 5 into the internal address signal. Address terminals 5 are for externally inputting the address signal A0-An. Random input/output buffer 6 applies a data signal WIOi from random input/output terminals 7 to a memory cell of memory cell array 1 selected by row decoder 2 and column decoder 3, or applies a data signal from a memory cell of memory cell array 1 selected by row decoder 2 and column decoder 3 to random input/output terminals 7. Random input/output terminals 7 are for applying the externally applied data signal WIOi to random input/output buffer 6, or providing a data signal from random input/output buffer 6 to the outside.

The VRAM further includes a data transfer bus 8, a serial register 9, a serial selector 10, a serial clock buffer 11, a serial clock terminal 12, a serial input/output buffer 13, serial input/output terminals 14, a quote signal generating circuit 15, and a quote terminal 16.

Data transfer bus 8 transfers data between a row of memory cell array 1 selected by row decoder 2 and serial register 9. Serial register 9, which includes the same number of register elements as that of memory cells constituting one row of a memory cell array 1, stores data transferred from memory cells constituting one row of memory cell array 1 in the register elements to divide the data into data stored in the upper half of the register elements and data stored in the lower half of the register elements, and serially provides respective data.

Serial register 9 also stores data applied from serial input/output buffer 13 in the register elements, and transfers the data to memory cells constituting one row of memory cell array 1 through data transfer bus 8. Serial selector 10 selects the register elements of serial register 9 one by one in response to a serial clock SC from serial clock buffer 11, so that data stored in the register elements are provided.

Serial clock buffer 11 applies the serial clock SC from serial clock terminal 12 to serial selector 10. Serial input/output buffer 13 applies serial data from serial register 9 to serial input/output terminal 14, or applies serial data SIOi from serial input/output terminal 14 to serial register 9.

Quote signal generating circuit 15 generates a quote signal QSF indicating which of the data stored in the upper side of the register elements and in the lower side of the register elements is now being provided, based on a counter signal CT from serial selector 10, to provide the same to quote terminal 16. Quote terminal 16 is for providing the quote signal QSF to the outside.

The VRAM further includes a clock generator 17, and external control terminals, such as a specific function select terminal 18 and address strobe control terminals 19.

Clock generator 17 generates an internal control signal based on external control signals DSF, *RAS, *CAS, *DT/*OE, and *WB/*WE from the external control terminals. Specific function select terminal 18 is for externally inputting the specific function select signal DSF for selecting a specific function, such as block write, write-per-bit, and split data transfer. Address strobe control terminal 19 is for externally inputting the external control signal *RAS or *CAS indicating a timing to strobe a row address or a column address to row decoder 2 or column decoder 3. Here, the * mark attached in front of a signal indicates that the signal follows the negative logic (is in the active state when it is at an "L (logical low)" level).

The VRAM further includes a fuse circuit 20 and a redundant circuit 21 and 1a. Referring to FIG. 10, fuse circuit 20 generates a redundant signal *RDD for activating redundant circuit 21. Fuse circuit 20 including a fuse F generates the redundant signal *RDD of an "L" level by fuse F being disconnected by laser, when redundant circuit 21 is used. The redundant circuit includes spare memory cells 1a. When any defective memory cell exists among normal memory cells, the address of the defective memory cell is programmed in advance, so that the redundant circuit activates one of spare memory cells 1a in place of the defective memory cell.

FIG. 11 is a schematic diagram showing fuse circuit 20 and a part of redundant circuit 21. Referring to FIG. 11, where redundant circuit 21 is used, fuse F of fuse circuit 20 is disconnected, so that the redundant signal *RDD at an "L" level is provided. A program circuit 21a which is a part of redundant circuit 21 is activated by the redundant signal *RDD. Program circuit 21a has the address of a defective memory cell programmed in advance, so as to provide a select signal SL indicating that a spare memory cell is selected in place of the defective memory cell, on application of a decode signal CQi of a specific column address activating the defective memory cell.

As described above, the redundant circuit includes spare memory cells 1a constituting several rows and/or several columns, whereby, in the case of presence of any defective memory cell in memory cell array 1, a spare memory cell is selected in place of the defective memory cell on application of an address signal selecting the defective memory cell. Accordingly, even if any defect exist in a part of memory cell array 1, memory cell array 1 can be used as a non-defective one.

In the case of any general fault in a VRAM, verification might be required whether the fault is caused by use of a redundant circuit or not. Although a microscope may be employed for externally verifying whether fuse F of fuse circuit 20 is disconnected or not, it cannot be used in mold products.

A method of verifying whether fuse F of fuse circuit 20 is disconnected or not without a microscope is disclosed in U.S. Pat. No. 4,480,199. Briefly, in this method, considering the fact that a current flowing throughout a device is decreased when a fuse is disconnected, it is determined whether a redundant circuit is being used or not by applying a higher voltage than a normal power supply voltage to the device, and detecting a current flowing therethrough at that time.

In such a method, however, since a higher voltage than a normal power supply voltage is applied, a current flowing therethrough is disadvantageously increased. In addition, it is disadvantageously increased as the number of fuse circuits increases. Moreover, since currents flowing through a fuse vary, it is difficult to accurately determine whether the fuse is disconnected or not.

In order to solve such a problem, a semiconductor memory device is disclosed in Japanese Patent Laying-Open No. 63-217600, which is constituted so as to read data as to disconnection of a fuse through an output buffer for outputting data from a memory cell array.

FIG. 12 is a schematic diagram of a circuit showing the main part of such a semiconductor memory device. Referring to FIG. 12, the semiconductor memory device includes a memory cell array 1, an output buffer circuit 22, a fuse circuit 23, a power supply initialize circuit 24 and transfer gates 25 and 26.

Output buffer circuit 22 normally outputs data from memory cell array 1 to the outside. An output node N2 of fuse circuit 23 corresponding to fuse circuit 20 described above is at an "L" level when a fuse F is not disconnected, while it is at an "H (logical high)" level when fuse F is disconnected. Power supply initialize circuit 24 generates a pulse signal $\phi$ upon sensing power-on. Transfer gates 25 and 26 are alternately rendered conductive, or non-conductive in response to the pulse signal $\phi$ from power supply initialize circuit 24.

In this semiconductor memory device, disconnection of fuse F can be verified without increasing a current flow throughout the device. Immediately after power-on, however, respective nodes and transistors are so unstable that disconnection of fuse F cannot be verified accurately. Additionally, since the pulse signal $\phi$ generated by power-on is utilized, turn-off of power is unpractically required for another verification of disconnection.

SUMMARY OF THE INVENTION

One object of the present invention is to provide a semiconductor memory device capable of readily verifying whether a redundant circuit is being used or not from the outside.

Another object of the present invention it to provide a semiconductor memory device capable of verifying whether a redundant circuit is being used or not without a microscope.

Still another object of the present invention is to enable verification as to whether a redundant circuit is being used or not, even in a semiconductor memory device of a mold type.

A further object of the present invention is to provide a semiconductor memory device capable of verifying whether a redundant circuit is being used or not without increasing current consumption.

Still further object of the present invention is to provide a semiconductor memory device capable of accurately verifying whether a redundant circuit is being used or not.

Still further object of the present invention is to provide a semiconductor memory device capable of verifying whether a redundant circuit is used or not at an arbitrary timing.

Still further object of the present invention is to provide a semiconductor memory device capable of verifying whether a redundant circuit is being used or not by an existing terminal, without provision of a new terminal.

In accordance with one aspect of the present invention, the semiconductor memory device reading and writing data through random access includes an external terminal, a memory cell array, a row selecting circuit, a column selecting circuit, a redundant circuit, a fuse circuit and a detecting circuit.

The external terminal receives or applies a signal from or to the outside. The memory cell array includes a plurality of memory cells arranged in a matrix constituted of rows and columns. The row selecting circuit selects any one of rows in the memory cell array. The column selecting circuit selects any one of columns in the memory cell array.

The fuse circuit generates a redundant signal when the memory cells includes one or more defective memory cells.

The redundant circuit includes a plurality of spare memory cells and an activating circuit. The activating circuit responds to the redundant signal to activate selectively one or more spare memory cells in place of the defective memory cells.

The detecting circuit responds to an input signal externally applied through the external terminal to detect the redundant signal and provide the same to the outside.

In accordance with another aspect of the present invention, the semiconductor memory device reading and writing data through random access, and at least reading data through serial access includes an external terminal, a memory cell array, a row selecting circuit, a column selecting circuit, a serial register, a data transfer bus, a quote signal generating circuit, a redundant circuit, a fuse circuit, a selecting circuit and a monitor terminal.

The serial register, which includes the same number of register elements as that of memory cells constituting one row of the memory cell array, divides data stored in the register elements into data stored in the upper half of the register elements and data stored in the lower half of the register elements, to serially provide respective data to the outside.

The data transfer bus transfers data in memory cells constituting a row selected by row selecting circuit to respective register elements of the serial register. The quote signal generating circuit generates a quote signal indicating which data stored in the upper side or the lower side of register element is being provided.

The selecting circuit responds to an input signal externally received through the external terminal to select either the quote signal or the redundant signal. The monitor terminal provides the signal selected by the selecting circuit to the outside.

Therefore, a main advantage of the present invention is that a redundant signal indicating whether the redundant circuit is being used or not is generated by the fuse circuit, and detected by the detecting circuit in response to an externally received signal, and provided to the outside, whereby use of the redundant circuit can be accurately verified from the outside without using a microscope and increasing current consumption.

Another advantage of the present invention is that a redundant signal is detected in response to an externally received input signal, whereby use of the redundant circuit can be verified at an arbitrary timing.

Still another advantage of the present invention is that a quote signal is generated by the quote signal generating circuit, while a redundant signal is generated by the fuse circuit, so that the selecting circuit selects either of the quote signal and the redundant signal in response to an externally received input signal to provide the select signal through the monitor terminal to the outside, whereby use of the redundant circuit can be accurately verified from the outside without using a microscope and increasing current consumption.

A further advantage of the present invention is that either of the quote signal and the redundant signal is selected, whereby use of the redundant circuit can be verified at an arbitrary timing.

Still further advantage of the present invention is that a redundant signal and a quote signal share a terminal for outputting to the outside, whereby a practical device is provided which does not require provision of a new terminal for outputting a redundant signal.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of a semiconductor memory device in accordance with the present invention will hereinafter be described in detail with reference to the drawings.

[First Embodiment]

Figure 1:
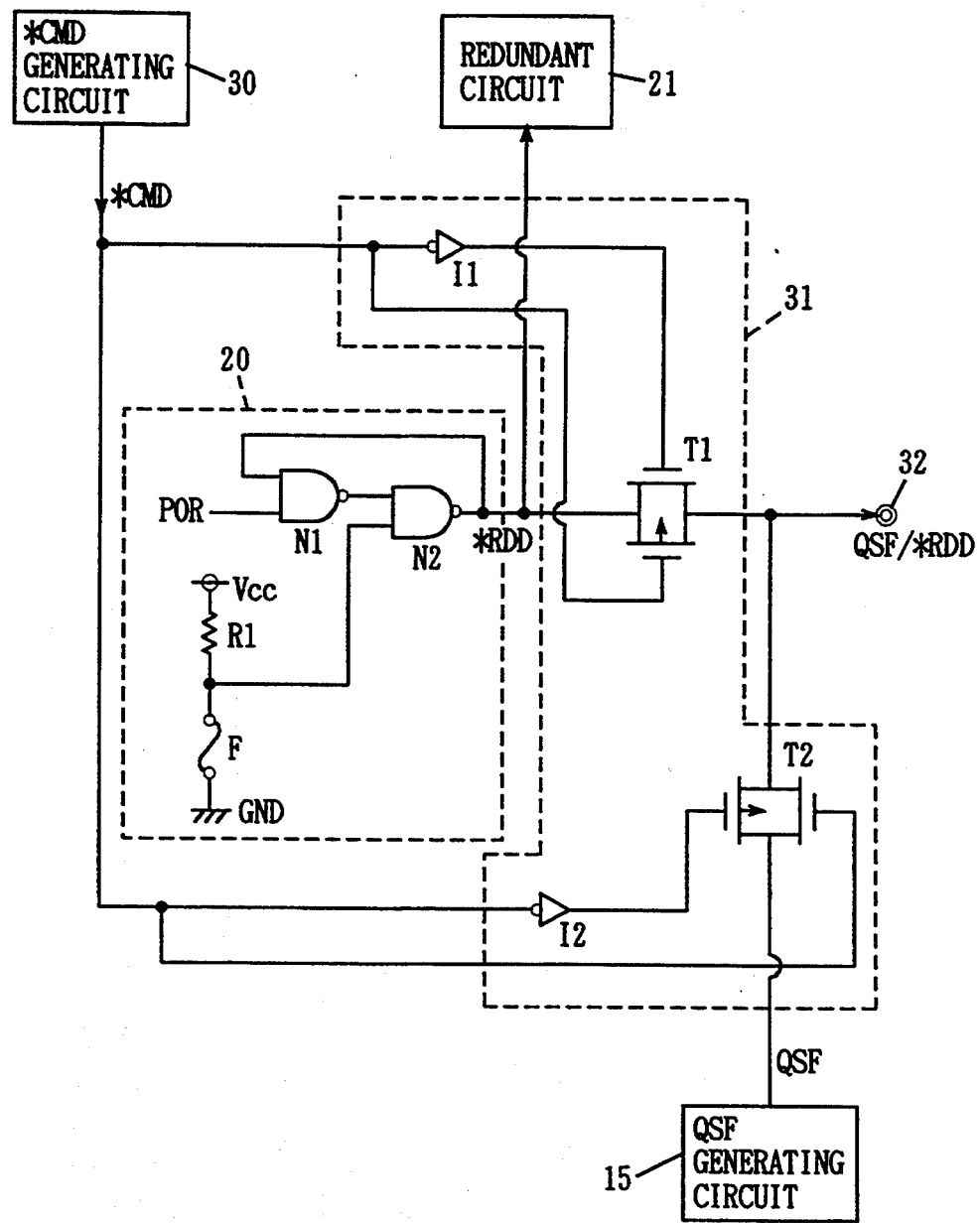
FIG. 1 is a block diagram showing a main part of a VRAM in a first embodiment of a semiconductor memory device in accordance with the present invention.
Figure 2:
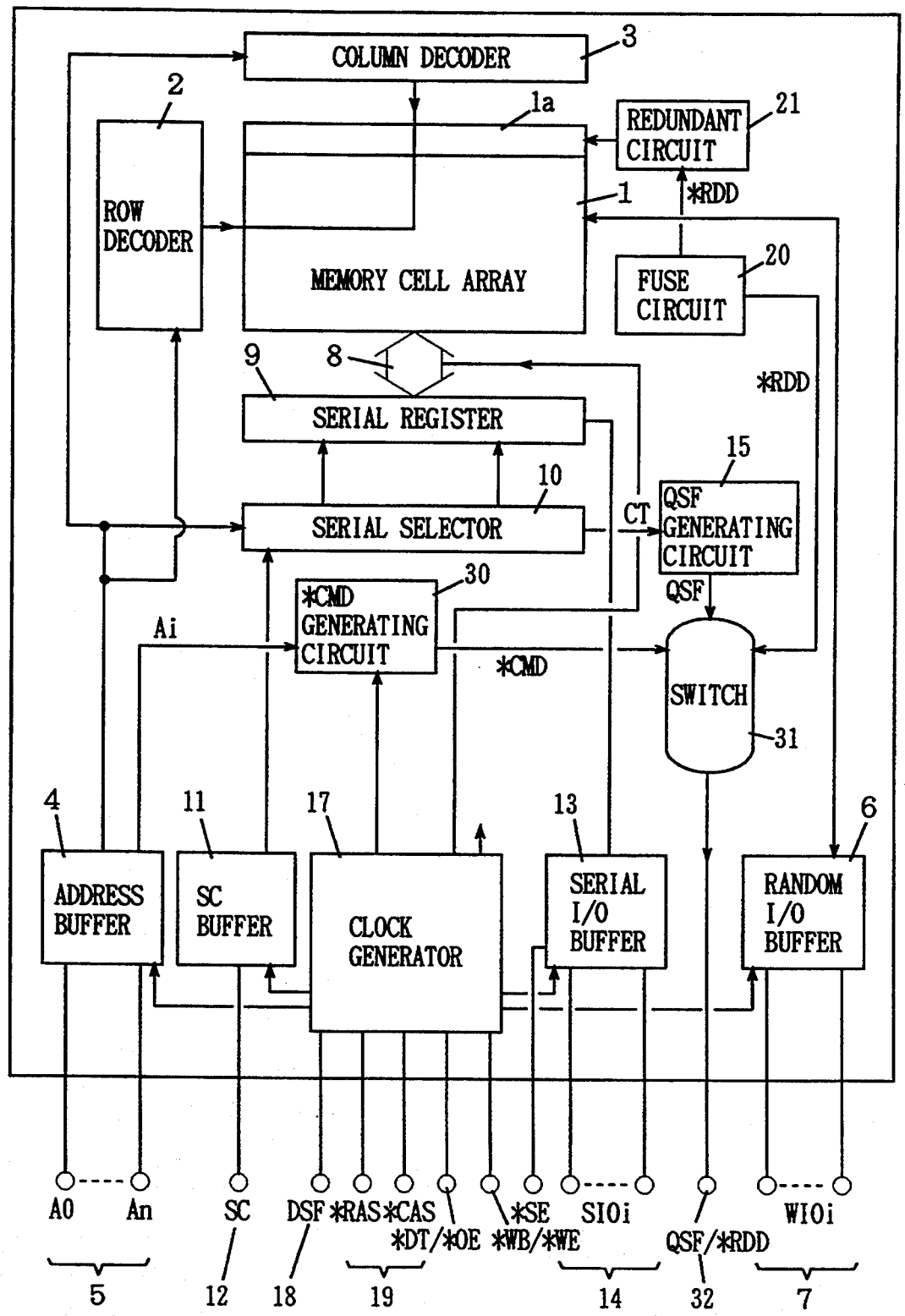
FIG. 2 is a block diagram showing the whole structure of the VRAM the main part of which is shown in FIG. 1.

FIG. 2 is a block diagram showing the whole structure of a VRAM in a first embodiment of the present invention, and FIG. 1 is a block diagram showing a main part of the VRAM shown in FIG. 2.

Referring to FIG. 2, the VRAM includes a memory cell array 1, a row decoder 2, a column decoder 3, an address buffer 4, address terminals 5, a random input-/output buffer 6, and random input/output terminals 7.

The VRAM further includes a data transfer bus 8, a serial register 9, a serial selector 10, a serial clock buffer 11, a serial clock terminal 12, a serial input/output buffer 13, serial input/output terminals 14, and a quote signal generating circuit 15.

The VRAM further includes a clock generator 17 and external control terminals including a specific function select terminal 18 and address strobe control terminals 19.

Figure 9:
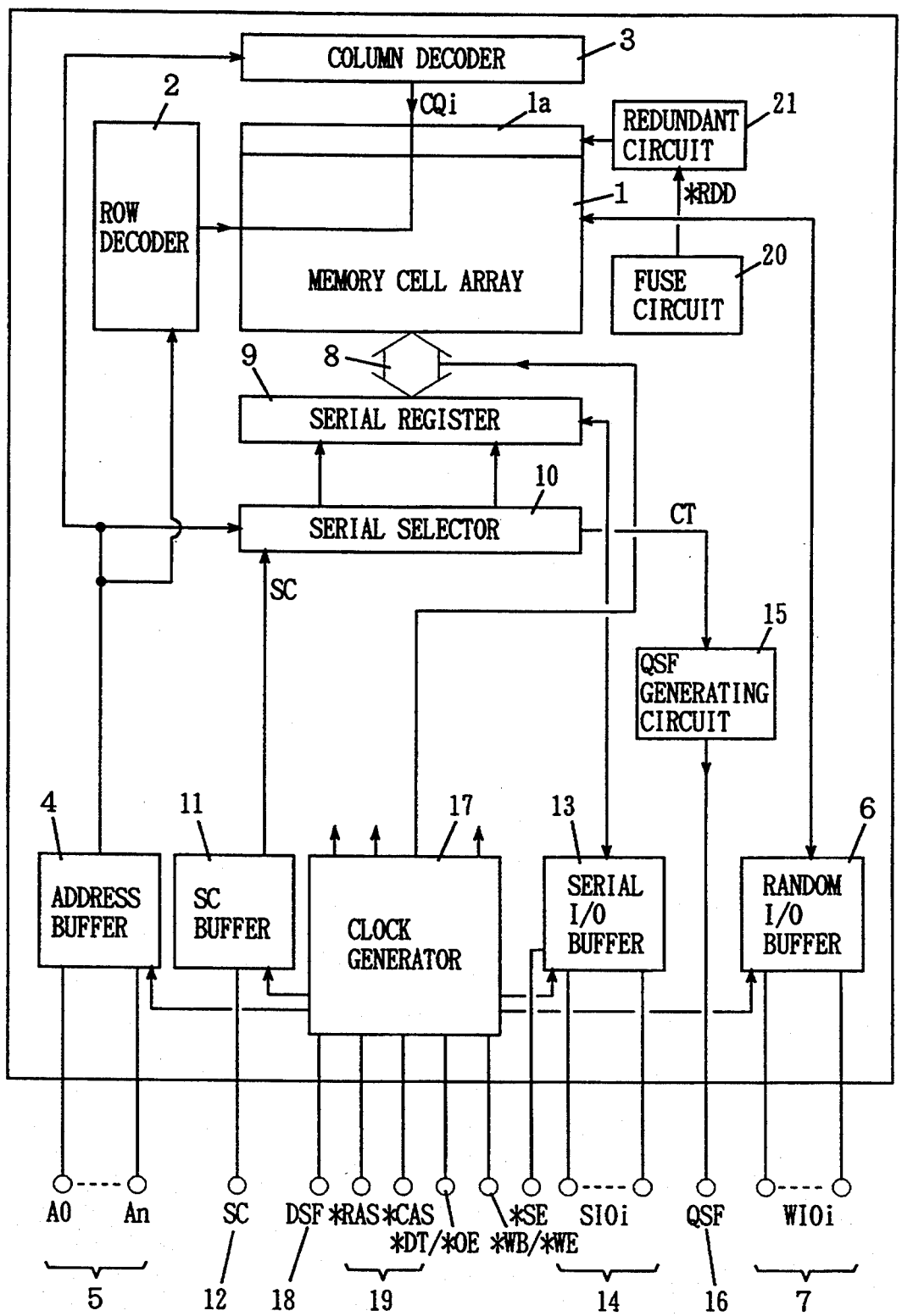
FIG. 9 is a block diagram showing the whole structure of a conventional VRAM.
Figure 10:
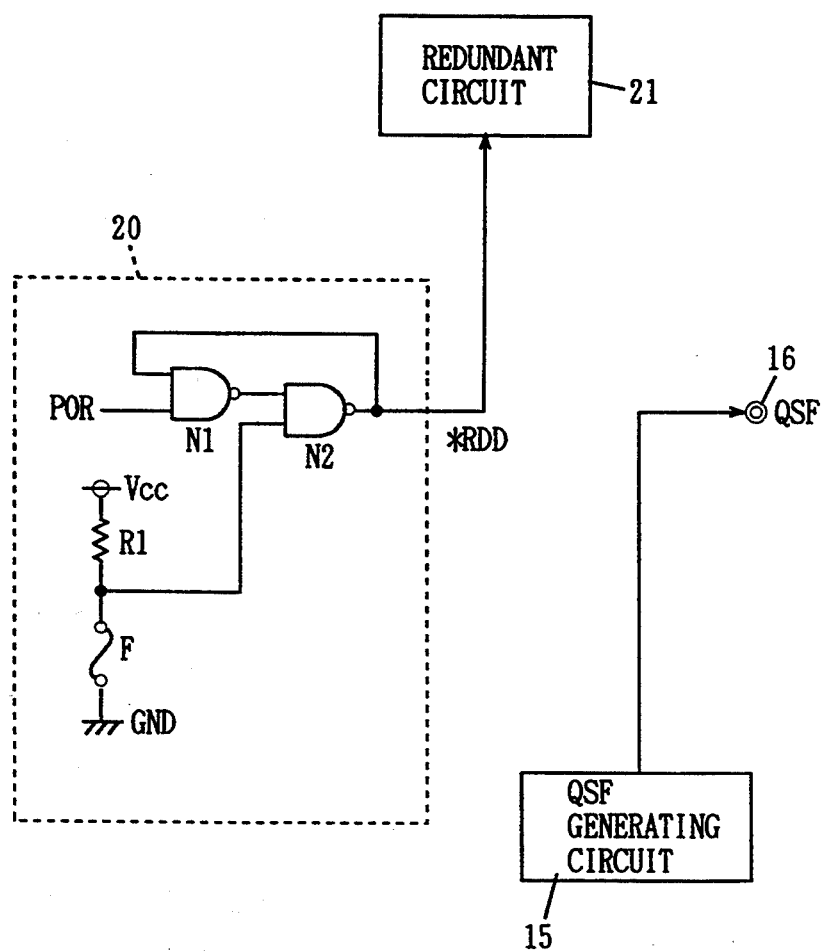
FIG. 10 is a block diagram showing a part of the VRAM shown in FIG. 9.

The VRAM is a semiconductor memory device reading and writing data through random access, and reading and writing data through serial access. Each of the portions denoted by the identical characters in FIG. 9 showing a conventional VRAM corresponds to, or is identical to the conventional one. This is also applied to the other drawings.

The VRAM further includes a fuse circuit 20 and a redundant circuit 21 and 1a.

The VRAM, unlike the conventional one, further includes a command signal generating circuit 30, a switch 31 and a monitor terminal 32.

Command signal generating circuit 30 receives an address signal Ai from address buffer 4 and an internal control signal from clock generator 17 to generate a command signal *CMD based on these signals. Switch 31 responds to the command signal *CMD from command signal generating circuit 30 to select between a quote signal QSF from quote signal generating circuit 15 and a redundant signal *RDD from fuse circuit 20, and provides either of the signals QSF and *RDD to monitor terminal 32. Monitor terminal 32, having a function to provide the redundant signal *RDD to the outside in addition to that of conventional quote terminal 16, is for outputting either of the signals QSF and *RDD selected by switch 31.

Referring to FIG. 1, fuse circuit 20 includes a fuse F, a resistor R1, and two NAND gates N1 and N2.

Fuse circuit 20 generates the redundant signal *RDD indicating whether redundant circuit 21 is being used or not. Switch 31 includes two transfer gates T1 and T2 and two inverters I1 and I2. Transfer gates T1 and T2 are alternately turned on in response to the command signal *CMD from command signal generating circuit 30 to provide the redundant signal *RDD or the quote signal QSF to monitor terminal 32.

Figure 3:
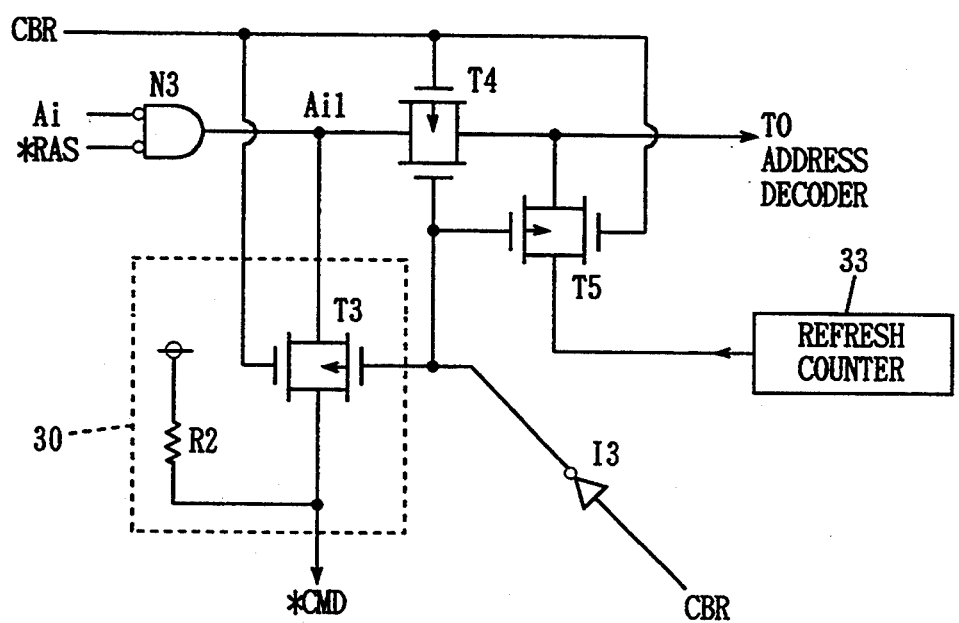
FIG. 3 is a schematic diagram of showing a command signal generating circuit and its peripheral circuitry of the VRAM shown in FIGS. 1 and 2.

FIG. 3 is a schematic diagram showing one example of command signal generating circuit 30 shown in FIGS. 1 and 2 in conjunction with its peripheral circuitry. Referring to FIG. 3, command signal generating circuit 30 includes a transfer gate T3 and resistor R2. The peripheral circuitry other than command signal generating circuit 30 shown in FIG. 3 also exists in a conventional VRAM. In FIG. 3, a gate N3 applies an external address signal Ai to an address decoder according to the internal control signal *RAS. A transmission gate T4 prevents the external address Ai from being transferred as an internal address to the decoder in a *CAS Before *RAS refresh cycle (hereinafter referred to as "CBR refresh cycle"). A transmission gate T5 has an internal address signal from a refresh counter 33 transferred to the decoder in the CBR refresh cycle.

Transmission gate T3 of command signal generating circuit 30 provides the address signal Ai externally applied to switch 31 as the command signal *CMD in the CBR refresh cycle. Resistor R2 pulls up an output node to a power supply voltage at the time of transmission gate T3 being in the non-conductive state.

The description will be made of the operation of the VRAM.

Figure 11:
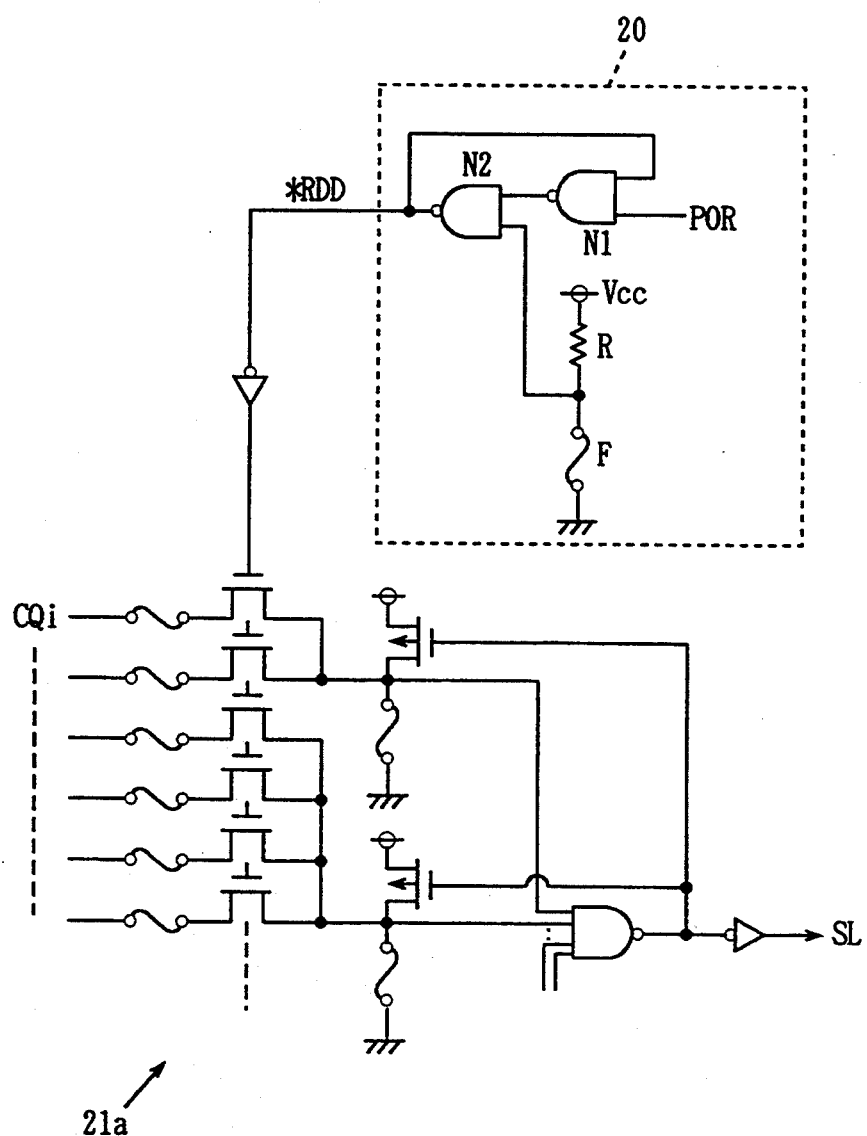
FIG. 11 is a schematic diagram showing a part of the redundant circuit shown in FIG. 10 in more detail.
Figure 12:
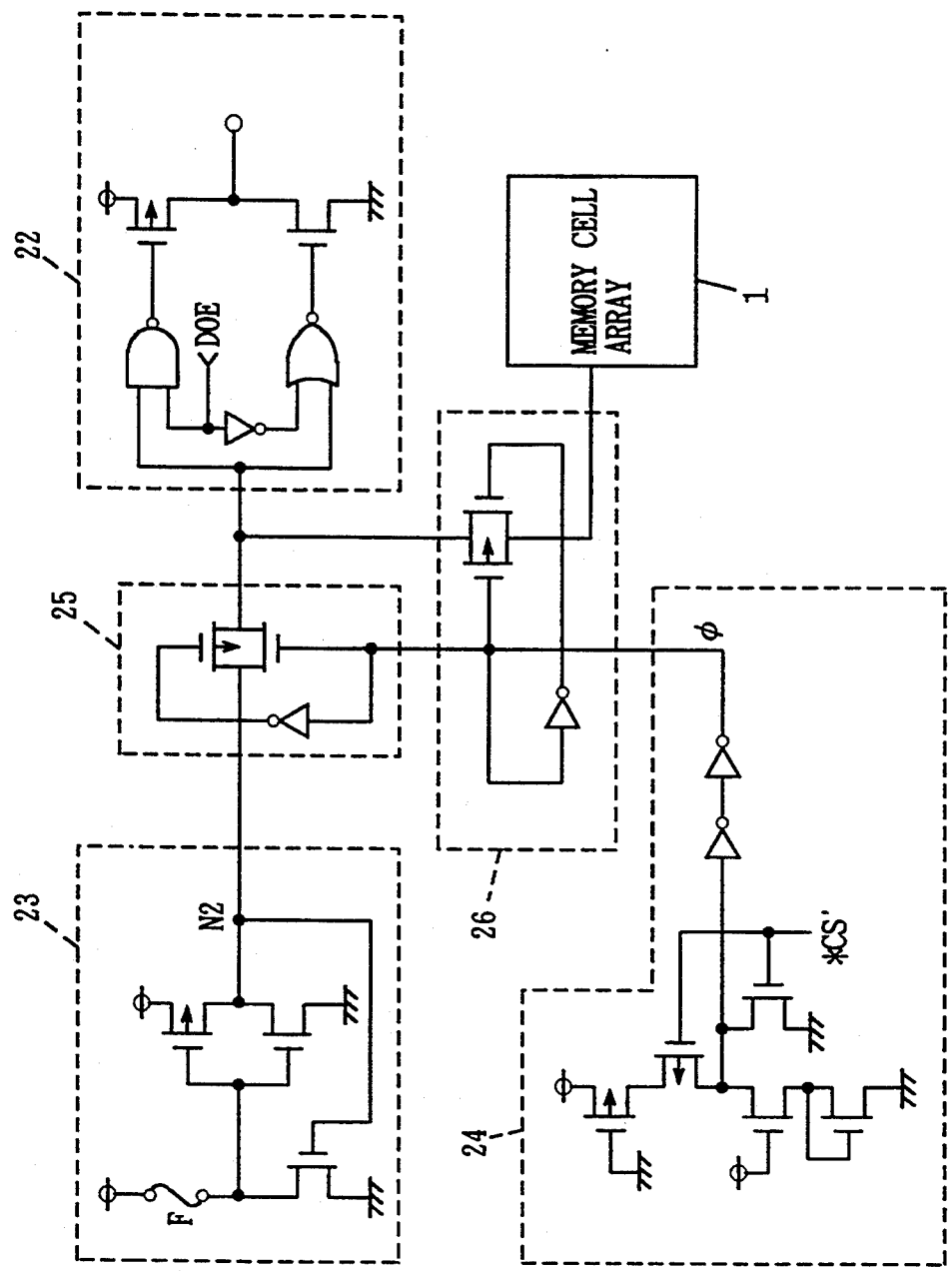
FIG. 12 is a block diagram showing another embodiment of a conventional semiconductor memory device.

When redundant circuit 21 is being used, fuse F of fuse circuit 20 is disconnected by laser. In fuse circuit 20, a control signal POR is a signal which becomes an "L" level a constant time period after power-on. Accordingly, the redundant signal *RDD at an "L" level is provided the constant time period after power-on. Consequently, program circuit 21a shown in FIG. 11 is activated, so that redundant circuit 21 is used.

Figure 4:
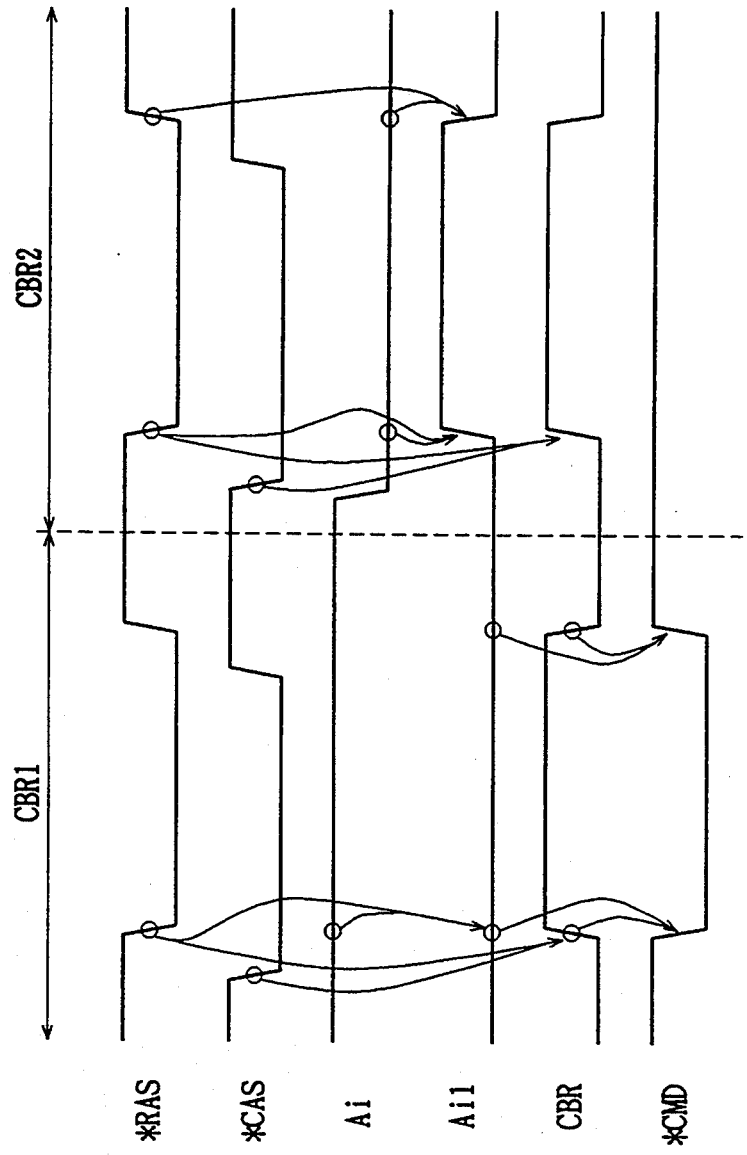
FIG. 4 is a timing chart showing the operation of the VRAM shown in FIGS. 1 to 3.

When the CBR refresh cycle shown in the timing chart of FIG. 4 is performed in this condition, an internal control signal CBR is generated by clock generator 17. In the CBR refresh cycle, the internal control signal CBR rises when the control signal *CAS is at an "L" level at the time of fall of the control signal *RAS, and falls at the time of rise of the control signal *RAS.

When the CBR refresh cycle is performed, so that the internal control signal CBR attains an "H" level, transfer gate T5 is turned on simultaneously with turn-off of transfer gate T4. Accordingly, an external address is interrupted, and instead, an internal address from refresh counter 33 is provided to the address decoder. Refresh operation is thus performed for holding data stored in a memory cell.

When the internal control signal CBR attains an "H" level, transfer gate T3 of command signal generating circuit 30 is turned on. In response to application of the control signal Ai of an "H" level from prescribed address terminal 5 at this time, an internal control signal Ai1 is generated by gate N3 supplied with the internal control signal *RAS, and provided as the command signal *CMD through transfer gate T3.

More specifically, in a first CBR refresh cycle period CBR1 shown in FIG. 4, when the control signal Ai at an "H" level is applied from address terminal 5, the command signal *CMD at an "L" level is provided. In a second CBR refresh cycle period CBR2, when the control signal Ai at an "L" level is applied from address terminal 5, that is, terminal 5 is in the normal state, the command signal *CMD at an "H" level is provided.

Subsequently, the control signal *CMD generated by command signal generating circuit 30 is applied to switch 31. When the control signal *CMD at an "L" level is applied, transfer gate T2 is turned off simultaneously with turn-on of transfer gate T1 of switch 31. Therefore, the quote signal QSF from quote signal generating circuit 15 is interrupted by transfer gate T2, and the redundant signal *RDD from fuse circuit 20 is applied to monitor terminal 32 through transfer gate T1, and provided from monitor terminal 32 to the outside. Therefore, use of redundant circuit 21 can be verified by detecting the redundant signal *RDD at an "L" level.

When the command signal *CMD at an "H" level is applied, transfer gate T2 is turned on simultaneously with turn-off transfer gate T1 of switch 31. Accordingly, the redundant signal *RDD from fuse circuit 20 is interrupted by transfer gate T1, and the quote signal QSF from the quote signal generating circuit 15 is applied to monitor terminal 32 through transfer gate T2, and provided from monitor terminal 32 to the outside. The quote signal QSF can thus be detected in the normal case.

When redundant circuit 21 is not being used, since fuse F of fuse circuit 20 is not disconnected, the redundant signal *RDD at an "H" level is provided. Therefore, when the control signal Ai at an "H" level is applied from address terminal 5 in the CBR refresh cycle period, the command signal *CMD at an "L" level is provided from command signal generating circuit 30 to switch 31, and the redundant signal *RDD at an "H" level is provided through monitor terminal 32. Consequently, the fact that redundant circuit 21 is not being used can be verified by detecting the redundant signal *RDD at an "H" level.

As described above, in this VRAM, use of redundant circuit 21 can be verified without a microscope, and the same can be applied to a VRAM of a mold type.

Since the VRAM is constituted so as to detect the redundant signal *RDD by externally inputting the control signals *RAS, *CAS and Ai, the redundant signal *RDD can be detected at an arbitrary timing, and thus the redundant signal *RDD which is not in such an unstable operational state as immediately after power-on can be detected. As a result, use of redundant circuit 21 can be accurately verified. Moreover, the more stable redundant signal *RDD can be detected by prolonging the CBR refresh cycle period.

In addition, since the VRAM is constituted so as to provide the redundant signal *RDD from the monitor terminal, which corresponds to a quote terminal in a conventional VRAM, only when use of redundant circuit 21 is to be verified, a practical device can be provided which does not require provision of a new terminal.

Moreover, in this VRAM, more operational current flow than necessary does not occur, unlike in the semiconductor memory device disclosed in U.S. Pat. No. 4,480,199.

Furthermore, since all of the control signals *RAS, *CAS and Ai for detection of the redundant signal *RDD are applied from input terminals 5 and 19 which correspond to input terminals of a conventional VRAM, provision of a new terminal is not required. In particular, the control signal Ai does not require provision of a new terminal, because it is applied from address terminal 5 which is not used during the CBR refresh cycle period.

[Second Embodiment]

Figure 5:
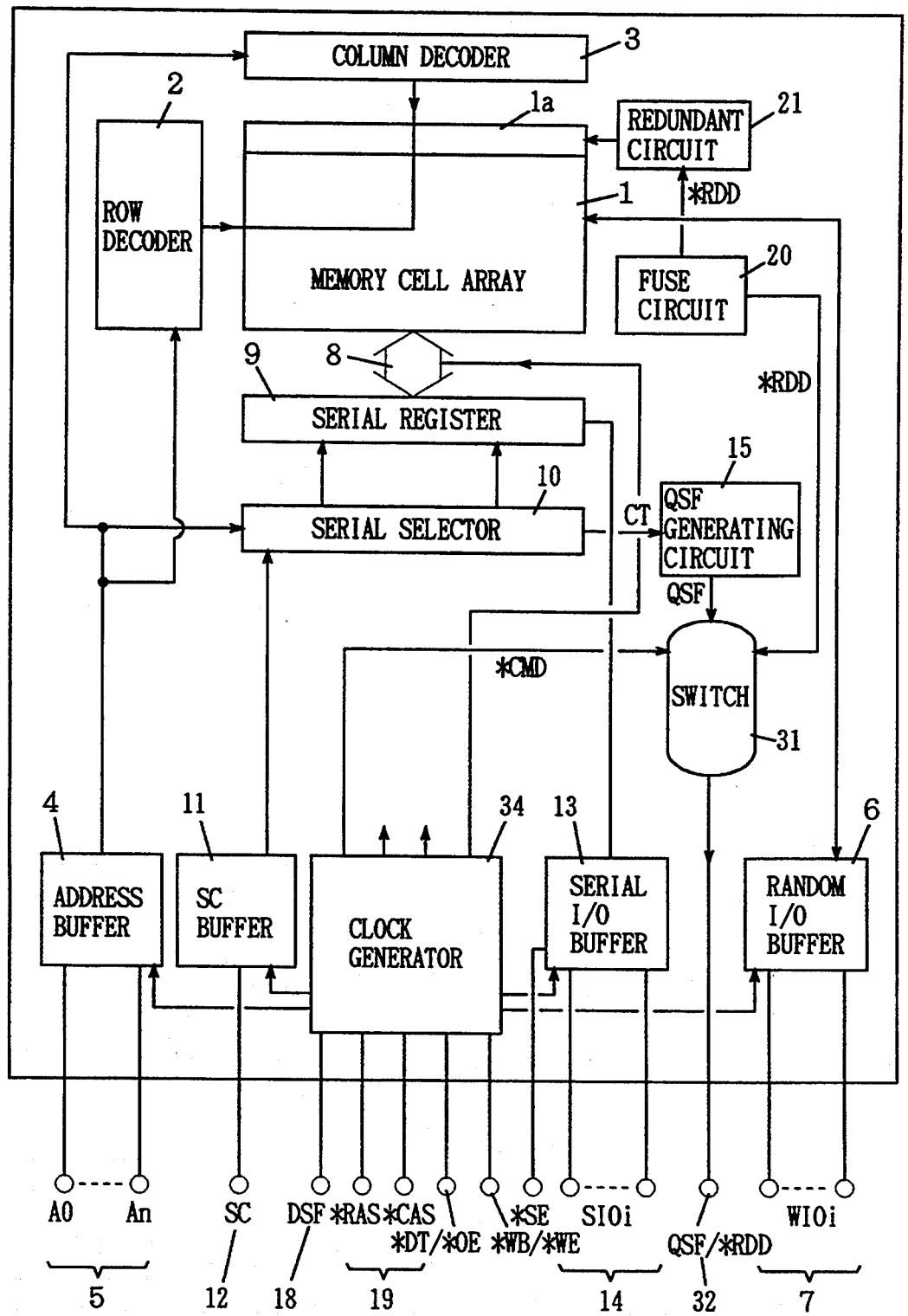
FIG. 5 is a block diagram showing the whole structure of a VRAM in a second embodiment of a semiconductor memory device in accordance with the present invention.
Figure 6:
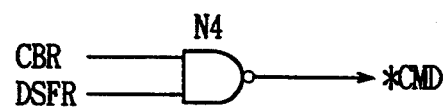
FIG. 6 is a schematic diagram of a circuit showing a main part of the clock generator of the VRAM shown in FIG. 5.

FIG. 5 is a block diagram showing the whole structure of VRAM in a second embodiment in accordance with the present invention.

Referring to FIG. 5, the VRAM mainly includes a memory cell array 1, a serial register 9, a quote signal generating circuit 15, a redundant circuit 21 and 1a, a fuse circuit 20, a clock generator 34, a switch 31, and a monitor terminal 32. Each of the portions denoted by the identical characters in FIG. 2 showing the first embodiment corresponds to, or is identical that shown in FIG. 2.

Therefore, clock generator 34 is the only difference of this VRAM from the VRAM in the first embodiment. Clock generator 34 includes an NAND gate N4 as shown in FIG. NAND gate N4 receives internal control signals CBR and DSFR to provide a control signal *CMD. The internal control signal DSFR rises with rise of a specific function select signal DSF from specific function select terminal 18, and falls with rise of a control signal *RAS.

Figure 7:
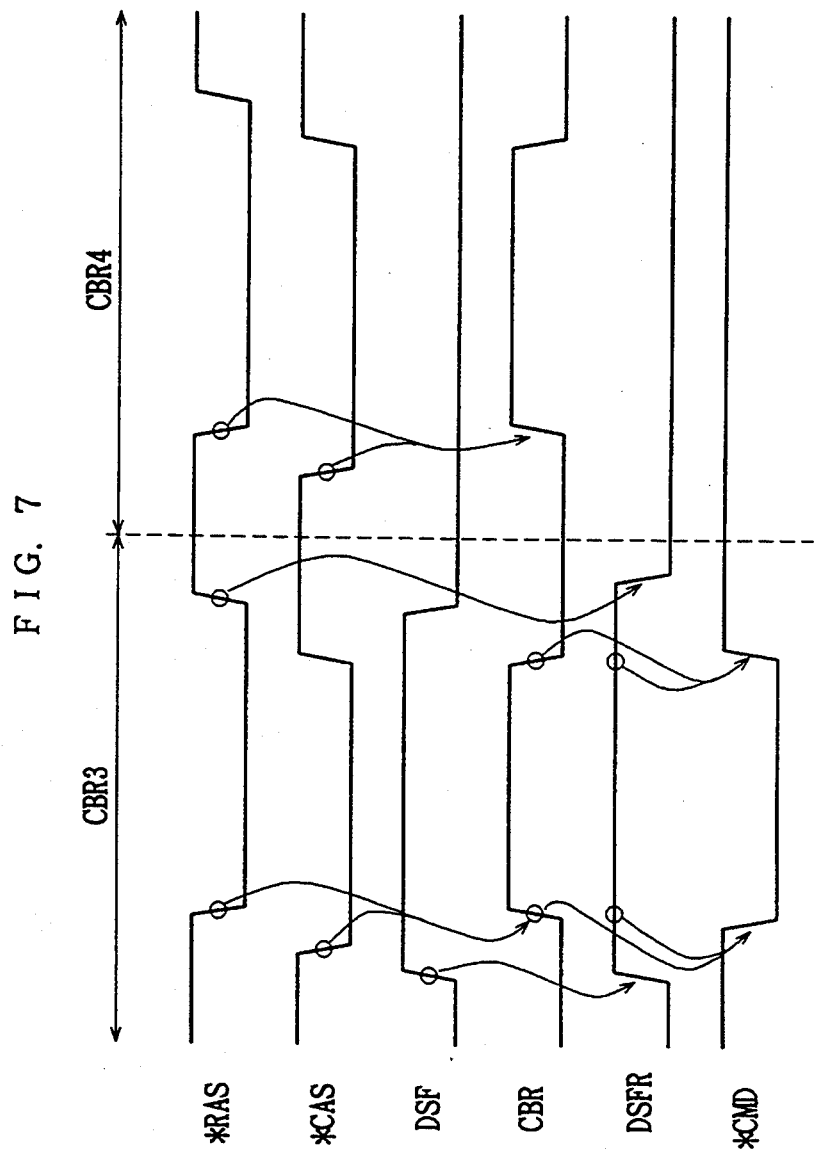
FIG. 7 is a timing chart showing the operation of the VRAM shown in FIGS. 5 and 6.

As shown in the timing chart of FIG. 7, in a third CBR refresh cycle period CBR3, when specific function select signal DSF at an "H" level is applied from a specific function select terminal 18, the internal control signal DSFR is generated which rises simultaneously with rise of the specific function select signal DSF, and falls simultaneously with rise of the control signal *RAS. NAND gate N4 performs logic operation of the internal control signal DSFR and the internal control signal CBR generated in the CBR refresh cycle to provide the result as the control signal *CMD. When the internal control signal CBR is at an "H" level, and the internal control signal DSFR is at an "H" level, the command signal *CMD at an "L" level is provided. In response to application of the command signal *CMD at an "L" level to switch 31, a redundant signal *RDD from fuse circuit 20 is provided from monitor terminal 32.

Therefore, if the redundant signal *RDD is at an "L" level, it is verified that the redundant circuit is being used, while if the redundant signal *RDD is at an "H" level, it is verified that the redundant circuit is not being used.

As shown in the timing chart of FIG. 7, in a fourth CBR refresh cycle period CBR4, when the specific function select signal DSF at an "L" level is applied, normal refresh operation is performed so that the control signal *CMD at an "H" level is provided, whereby the quote signal QSF from quote signal generating circuit 15 is provided from monitor terminal 32 as usual.

As described above, in this VRAM use of redundant circuit 21 can be accurately and readily verified, as in the first embodiment. Also, since the redundant signal *RDD can be detected at an arbitrary timing, use of redundant circuit 21 can be verified more accurately. Moreover, since the VRAM is structured so as to input the signals RAS, *CAS and DSF for generating the command signal *CMD, or output through terminals which correspond to those of a conventional VRAM the redundant signal *RDD indicating whether redundant circuit 21 is being used or not, a practical device is provided which does not require provision of a new terminal.

[Third Embodiment]

Figure 8:
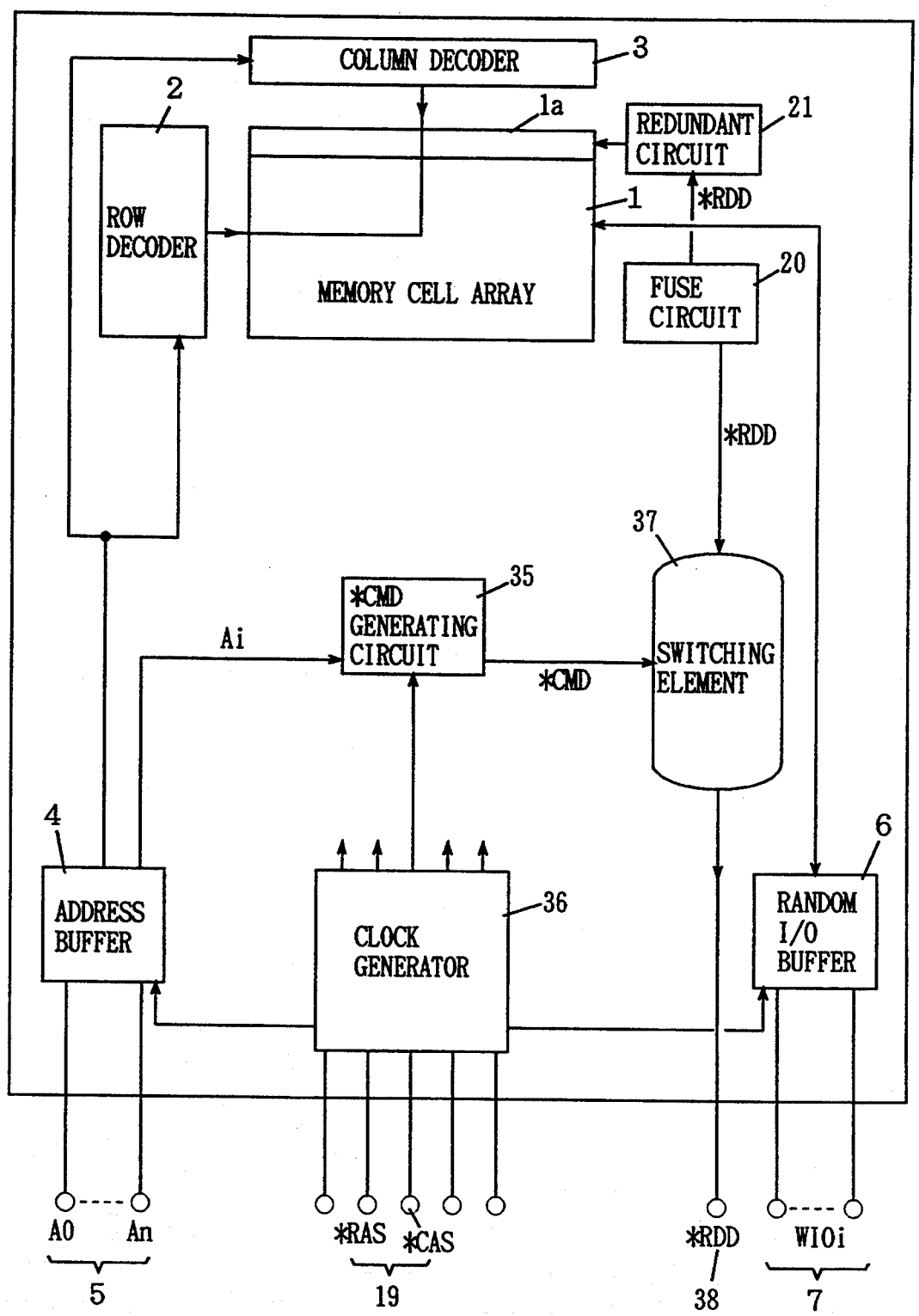
FIG. 8 is a block diagram showing the whole structure of a DRAM in a third embodiment of a semiconductor memory device in accordance with the present invention.

FIG. 8 is a block diagram showing the whole structure of a DRAM in a third embodiment in accordance with the present invention.

Referring to FIG. 8, the DRAM includes a memory cell array 1, an address buffer 4, a command signal generating circuit 35, a clock generator 36, a fuse circuit 20, a redundant circuit 21 and 1a, a switching element 37, and a detection terminal 38. The same characters as in the above-described VRAM denote the same or corresponding portions, respectively.

Accordingly, presence of command signal generating circuit 35 and switching element 37, and absence of components, such as a serial register and a serial selector, for reading and writing data through serial access are the main difference of the DRAM from the above-described VRAM. Specifically, this DRAM is a semiconductor memory device reading and writing data only through random access.

Command signal generating circuit 35 receives an internal control signal Ai from address buffer 4 and an internal control signal from clock generator 36 to generate a command signal *CMD. Switching element 37 including a transfer gate, for example, responds to the command signal *CMD from command signal generating circuit 35 to detect a redundant signal *RDD from fuse circuit 20, and provide the same to the outside through detection terminal 38. Clock generator 36 generates various internal control signals based on external control signals *RAS and *CAS applied from the external control terminal, and is different from clock generator 17 described above in that an internal control signal which is required only for a VRAM is not generated.

In the DRAM, in response to application of the control signal Ai from an address terminal 5 in the CBR refresh cycle period, command signal generating circuit 35 receiving the control signal Ai and an internal control signal from clock generator 36 generates the command signal *CMD. When the command signal *CMD is at an "L" level, a transfer gate, for example, included in switching element 37, is turned on, so that a redundant signal *RDD from fuse circuit 20 is applied to detection terminal 38 through the transfer gate. Then, the redundant signal *RDD is provided to the outside from detection terminal 38.

Thus, it can be readily and accurately verified whether redundant circuit 21 is being used or not. Moreover, since the DRAM is constituted so as to detect the redundant signal *RDD in response to input signals from address terminals 5 and external control terminals 19, and provide the same to the outside, the redundant signal *RDD can be detected at an arbitrary timing.

Although various embodiments in accordance with the present invention have been described, the present invention is not limited to these embodiments, and can be performed in other manners.

For example, in the first or second embodiment, semiconductor memory device is constituted so as to select either a quote signal QSF or redundant signal *RDD by alternately turning on or off two transfer gates, while any means selecting either the quote signal QSF or the redundant signal *RDD may be employed.

Also, in the first to third embodiments, the semiconductor memory device generates a command signal *CMD in response to input signals from address terminals 5, specific function select terminal 18, and external control terminals 19, while the control signal *CMD may be generated in response to an input signal from any other terminal. In other words, it is only necessary to detect a redundant signal in response to an external input signal and provide the same to the outside. It should be also noticed that the input signal is not limited to a signal applied during refresh operation.

In addition, data transfer bus 8 allows bi-directional data transfer in the first and second embodiments, while data transfer at least from memory cell array 1 to serial register 9 is only necessary. Furthermore, a serial register should at least provide serially data stored in the register elements to the outside, and is not limited to the one also capable of external input.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   an external terminal for receiving a signal from the outside, or providing a signal to the outside;
   a memory cell array including a plurality of memory cells arranged in a matrix constituted of rows and columns;
   row selecting means for selecting any one row in said memory cell array;
   column selecting means for selecting any one column in said memory cell array;
   redundant signal generating means for generating a redundant signal when said plurality of memory cells include one or some defective memory cell;
   redundant means including a plurality of spare memory cells, and activating means responsive to said redundant signal for selectively activating one or some spare memory cells of said plurality of spare memory cells in place of the defective memory cells; and
   detecting means responsive to an input signal externally applied through said external terminal for detecting said redundant signal to provide the detected signal to the outside.

2. The semiconductor memory device according to claim 1, wherein
   said external terminal includes an address terminal for externally receiving an address signal which specifies a row or a column to be selected by said row selecting means or said column selecting means, and
   said detecting means responsive to said address signal externally applied through said address terminal for detecting said redundant signal to provide the detected signal to the outside, while self-refresh operation is performed for holding data stored in said memory cells.

3. The semiconductor memory device according to claim 1, wherein
   said external terminal includes a specific function select terminal for externally receiving a specific function select signal which selects a specific function other than normal functions, and
   said detecting means responsive to said specific function select signal externally applied through said specific function select terminal for detecting said redundant signal to provide the detected signal to the outside, while self-refresh operation is performed for holding data stored in said memory cells.

4. The semiconductor memory device according to claim 1, wherein
   said detecting means includes
      command signal generating means responsive to said input signal externally applied through said external terminal for generating a command signal, and
      switching means responsive to said command signal for detecting said redundant signal to provide the detected signal to the outside.

5. A semiconductor memory device, comprising:
   an external terminal for receiving a signal from the outside, or providing a signal to the outside;
   a memory cell array including a plurality of memory cells arranged in a matrix constituted of rows and columns;
   row selecting means for selecting any one row in said memory cell array;
   column selecting means for selecting any one column in said memory cell array;
   serial register means including
      the same number of register elements as that of memory cells constituting one row in said memory cell array, and
      means for dividing data stored in said register elements into data stored in the upper half of said register elements and data stored in the lower half of said register elements to serially provide respective data to the outside;
   data transfer means for transferring data in the memory cells constituting the row selected by said row selecting means to said register elements;
   quote signal generating means for generating a quote signal indicating which data stored in the upper half or lower half of said register elements is being provided;
   redundant signal generating means for generating a redundant signal when said plurality of memory cells include one or some defective memory cells;
   redundant means including a plurality of spare memory cells, and activating means responsive to said redundant signal for selectively activating one or some spare memory cells of said plurality of spare memory cells in place of the defective memory cells; and
   selecting means responsive to an input signal externally applied through said external terminal for selecting either said quote signal or said redundant signal; and
   a monitor terminal for providing the signal selected by said selecting means to the outside.

6. The semiconductor memory device according to claim 5, wherein
   said external terminal includes an address terminal for externally receiving an address signal which specifies row or a column to be selected by said row selecting means or said column selecting means, and
   said selecting means responsive to said address signal externally applied through said address terminal for selecting either said quote signal or said redundant signal, while self-refresh operation is performed for holding data stored in said memory cells.

7. The semiconductor memory device according to claim 5, wherein
   said external terminal includes a specific function select terminal for externally receiving a specific function select signal which selects a specific function other than normal functions, and
   said selecting means responsive to said specific function select signal externally applied through said specific function select terminal for selecting either said quote signal or said redundant signal, while self-refresh operation is performed for holding data stored in said memory cells.

8. The semiconductor memory device according to claim 5, wherein
   said selecting means includes
      command signal generating means responsive to said input signal externally applied through said external terminal for generating a command signal, and
      switching means responsive to said command signal for selecting either said quote signal or said redundant signal.

* * * * *